United States Patent [19]

Barnett et al.

[11] 3,715,245

[45] Feb. 6, 1973

[54] SELECTIVE LIQUID PHASE EPITAXIAL GROWTH PROCESS

[75] Inventors: Allen M. Barnett; Simeon V. Galginaitis, both of Schenectady, N.Y.

[73] Assignee: General Electric Company

[22] Filed: Feb. 17, 1971

[21] Appl. No.: 116,125

[52] U.S. Cl. ................148/171, 148/1.5, 317/235 R, 252/62.3 GA

[51] Int. Cl. ................H01l 7/00

[58] Field of Search ................148/171, 172, 173, 1.5; 252/62.3 GA

[56] References Cited

UNITED STATES PATENTS

| | | | |
|---|---|---|---|
| 3,585,087 | 6/1971 | Blum et al. | 148/173 X |
| 2,561,411 | 7/1951 | Pfann | 148/187 X |
| 3,171,762 | 3/1965 | Rutz | 148/1.5 X |
| 3,619,304 | 11/1971 | Naito | 148/171 |
| 3,611,069 | 10/1971 | Galginaitis et al. | 148/176 X |
| 3,535,772 | 10/1970 | Knight et al. | 148/171 X |

FOREIGN PATENTS OR APPLICATIONS

| | | | |
|---|---|---|---|
| 1,149,109 | 4/1969 | Great Britain | 148/171 |

*Primary Examiner*—G. T. Ozaki
*Attorney*—John F. Adhern et al.

[57] ABSTRACT

A process for selectively growing semiconductor material, particularly Group III-V semiconductor compounds, on semi-insulating substrates with uniform dissolution and regrowth in selected regions is disclosed. The fabrication of substantially planar monolithic semiconductor devices in a semi-insulating substrate and, in particular, light-emitting devices are also disclosed.

4 Claims, 3 Drawing Figures

Inventors:
Allen M. Barnett,
Simeon V. Galginaitis,
by Jerome C. Squillaro
Their Attorney.

SELECTIVE LIQUID PHASE EPITAXIAL GROWTH PROCESS

The present invention relates to the formation of semiconductor materials and more particularly to a liquid phase epitaxial growth process for semiconductor materials and devices. The present invention relates to U.S. Pat. No. 3,647,578 and also relates to copending patent applications Ser. No. 116,126, filed Feb. 17, 1971, and Ser. No. 116,005, filed Feb. 17, 1971, all of common assignee as the instant invention and incorporated herein by reference thereto.

Liquid phase epitaxy is a term generally applied to the growth of a single crystal layer of a material, such as a semiconductor material, by deposition from a solution containing the desired growth material. The aforementioned U.S. Pat. No. 3,647,578 describes a method for epitaxially growing semiconductor material, particularly Group III-V compounds, from a molten solution saturated with the semiconductor material. Means for epitaxially growing semiconductor material in selected regions of a semiconductor substrate are also described. This epitaxial growth process also provides uniform dissolution and regrowth at selected regions of a semiconductor substrate.

U.S. Pat. No. 3,535,772 to Knight et al describes a method for making bulk-effect devices by epitaxially growing an n-type layer of gallium arsenide on a semi-insulating substrate of gallium arsenide. The n-type layer is then masked and covered with a molten charge of tin saturated with gallium arsenide to produce a region of *n*+ conductivity so that ohmic contacts may be conveniently made to the *n*+ regions. As described by Knight et al, the *n*+ region is formed by raising the temperature of the molten charge of tin sufficiently to cause dissolution of a portion of the gallium arsenide n-type layer. The temperature of the substrate is then lowered until the molten tin again becomes saturated and tin-doped gallium arsenide is epitaxially deposited back onto the epitaxially grown n-type layer, thereby forming a *n*+ conductivity region in the regrown area.

The method described by Knight et al employs tin as a "modifying solvent," that is, as a semiconductor conductivity modifying impurity to produce the desired *n*+ region and as a solvent to dissolve the substrate material. While this method may be useful for the formation of *n*–*n*+ regions for bulk-effect devices, the method is unfortunately not useful for the fabrication of P-N junctions, for example, such as those advantageously employed for light-emitting devices. P-type regions or even *n*– regions can not be produced by the Knight et al method because there are no suitable acceptor-type dopants which can overcompensate for the donor-type impurities introduced by the tin solvent, at least in useful doping ranges, such as $10^{14}$ to $10^{18}$ atoms per cubic centimeter. Alternately, there are no suitable acceptor modifying solvents which may be used instead of tin, a donor-modifying solvent. Furthermore, the apparatus disclosed by Knight et al produces temperature gradients in the molten solution and causes uneven dissolution and regrowth of the semiconductor material. While this is no great disadvantage where only two simple ohmic contacts are desired, this method is unsuitable for the fabrication of light-emitting devices with uniform geometries, and particularly light-emitting arrays.

The fabrication of semiconductor light-emitting devices, for example, in monolithic form therefore requires the solution to numerous problems associated with the formation of P- and N-type semiconductor regions. For example, the fabrication of an X–Y matrix addressable array of light emitting devices in monolithic form requires optical isolation between array elements, electrical isolation between various structural elements and the formation of buried structures to obtain suitable thicknesses for semiconductor processing, while preserving the desired electrical and optical characteristics of the devices. Unfortunately, the processing technology developed for germanium and silicon devices, for example, is not compatible with the semiconductor materials useful as light-emitting devices. For example, Group III–V semiconductor compounds, such as, for example, gallium arsenide, gallium phosphide, indium phosphide and other useful materials for light-emitting devices are not readily amenable to the simple process of diffusion of n-type conductivity modifying impurities, for example. The diffusion, at best, is extremely slow and hence is unsatisfactory for commercial applications. These and other problems have severely limited the usefulness of light-emitting devices, in general.

It is therefore one object of our present invention to provide a selective liquid phase epitaxy process for growing semiconductor materials of p- and n-type conductivities on suitable substrates.

In accord with another object of our invention, electrically isolated semiconductor regions of selectively variable conductivity types are formed in semi-insulating substrates by selective dissolution of the substrate material and regrowth of desired conductivity semiconductor material therein.

It is yet another object of our present invention to provide a liquid phase epitaxy process, particularly for Group III-V semiconductor materials, wherein the solvent does not alter the properties of the epitaxial growth region.

In accord with still another object of our invention, selectively variable conductivity type regions are epitaxially grown from a solution containing the desired impurity dopants at sufficiently high temperatures to provide high growth rates while maintaining uniform dissolution and regrowth of the semiconductor material.

Another object of our present invention is to provide a liquid phase epitaxy process employing saturated solutions with an excess of semiconductor materials wherein the absolute temperature of the solution may vary substantially without adversely affecting the uniformity of the epitaxial growth.

Briefly, these and other objects of our invention are achieved in accord with one aspect thereof by a process comprising preparing a molten solution of a non-conductivity modifying solvent, such as gallium, the desired semiconductor material such as gallium phosphide and suitable conductivity-modifying impurities or dopants, if desired, for the epitaxial growth, heating the solution to a first temperature which produces a saturated solution with an excess of semiconductor material, immersing a suitable substrate into the saturated solution while abruptly heating the solution to a second temperature higher than the first temperature to produce the desired dissolution of the substrate surface and then lowering the temperature of the solution at a programmed rate until the desired epitaxial growth thickness is achieved.

In accord with one embodiment of our invention, a solution of substantially pure gallium with gallium phosphide and suitable acceptor- or donor-type impurity dopants are heated to a first temperature which causes the solution to become saturated with an excess of gallium phosphide. A substrate, such as semi-insulating gallium phosphide which is suitably masked for selective growth, is lowered into the saturated solution and the temperature thereof is increased abruptly by a few degrees to promote the desired dissolution of the substrate in the unmasked portions thereof. Next, the temperature of the solution is lowered at a programmed rate to promote uniform precipitation of semiconductor material in the unmasked portions of the substrate.

In accord with another novel feature of our invention, electrically isolated P-N light-emitting junctions are formed in a semi-insulating substrate in substantially the manner described above by epitaxially growing p-type semiconductor material, for example, over an n-type semiconductor material.

These and other novel characteristics of our invention are set forth in the appended claims. The invention itself, together with further objects and advantages thereof, may be understood with reference to the following detailed description taken in connection with the accompanying drawing in which:

Figure 1:
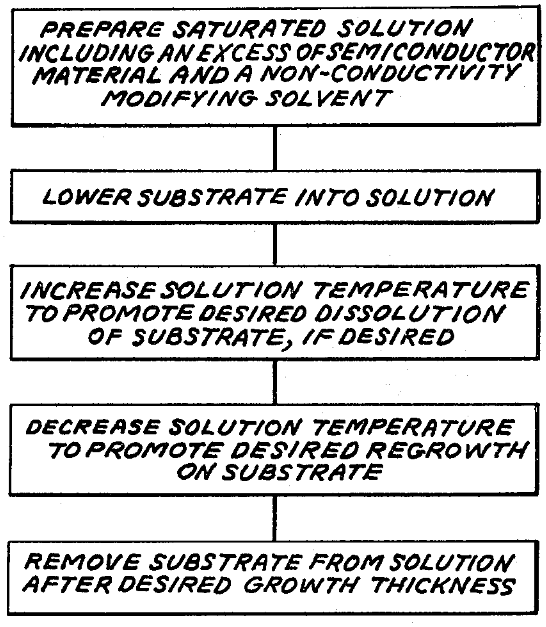
FIG. 1 is a flow diagram of a method for forming epitaxial growths on a substrate in accord with one embodiment of our invention.

FIG. 1 illustrates, by way of example, a flow diagram including the steps of practising the selective liquid phase epitaxial process in accord with one embodiment of our invention. The process includes preparing a solution including a non-conductivity modifying solvent (i.e., a material which does not function as a semiconductor conductivity-type modifying impurity), together with a sufficient amount of the desired semiconductor material and suitable conductivity modifying impurities, if desired, to produce a saturated solution (i.e., a solution which is in equilibrium with a solid phase at a given temperature) with excess semiconductor material. For example, epitaxial growth of Group III–V semiconductor compounds, such as gallium phosphide and gallium arsenide, for example, are advantageously made in accord with our invention by preparing a solution of substantially pure gallium as a solvent together with the desired semiconductor material to be deposited. Epitaxial growth of n-type gallium phosphide, for example, is achieved by preparing a quantity of pure gallium together with powdered gallium phosphide (or elemental gallium and phosphorus, if desired) and a donor dopant, such as tellurium, to produce a saturated solution with excess gallium phosphide. Alternately, if p-type conductivity material is desired, a suitable acceptor-type dopant such as zinc may be used if desired.

Suitable apparatus for practising our invention is described below with reference to FIGS. 2 and 3. However, with either apparatus, and in general, the epitaxial growth solution is contained in a vessel or crucible and heated to a first temperature at which the semiconductor material dissolves into the solvent and completely saturates the solvent. Selective liquid epitaxial growth on a substrate is achieved by selectively masking the substrate in regions where epitaxial growth is not desired. For example, a particularly desirable substrate for producing light-emitting devices in accord with one embodiment of our invention, is a highly resistive monocrystalline semiconductor material, such as gallium phosphide or gallium arsenide, for example, having a resistivity of the order of $10^4$ to $10^{12}$ ohm-centimeters. Substrates of this range of resistivities are generally called semi-insulating substrates. Gallium phosphide semi-insulating substrates are particularly suited for practising one embodiment of our invention because they are optically transparent to the wavelengths of emission from the light-emitting devices fabricated therein. This aspect of our invention will be described in greater detail below.

The masked substrate is positioned above the saturated solution until its temperature is in the order of that of the solution, typically 1050°C., and then the substrate is lowered into the solution to commence the selective epitaxial growth. If, however, dissolution of the substrate surface is desired before epitaxial growth, the solution temperature is abruptly increased by a small amount, generally less than 5°C., and then the temperature of the solution is decreased at a programmed rate, to cause the semiconductor material to precipitate out of solution and become deposited on the unmasked regions of the substrate. For n-type gallium phosphide growths, for example, the temperature is decreased at a rate of between 0.3° and 1.0°C. per minute, whereas for p-type gallium phosphide growths, the temperature is decreased at a rate of between 3° and 10°C. per minute. After the desired expitaxial growth is completed, the substrate is withdrawn from the solution and any excess solution is removed from the substrate.

In the event that dissolution of the substrate surface is not desired, the temperature of the solution is not increased because it is the increase in temperature which causes the solution to become unsaturated and dissolve the surface of the substrate. Hence, if no dissolution is desired, the solution temperature is not raised. In that event, epitaxial growth is commenced by decreasing the solution temperature in a programmed manner and for a sufficiently long period of time to produce the desired epitaxial growth.

The formation of an n-type epitaxial growth in a semi-insulating substrate is described with reference to FIG. 2. Here, we illustrate a typical apparatus for performing a liquid phase epitaxial growth of a semiconductor material in accord with the process of our present invention. The apparatus 10 includes a closed container 11 having a bottom portion **11*a* of a generally cylindrical configuration with a top portion 11*b* which fits in mating relation with the bottom portion 11*a* to form the exterior of the container 11**. The container 11 also includes a crucible 12 supported from the base of the lower portion of the closed container 11. The crucible 12 is desirably formed of graphite, boron nitride, quartz, or suitable refractory, nonreactive materials, and is at least partially filled with a solution 13 of the semiconductor material to be epitaxially deposited on a substrate 14 in accord with our invention. The substrate 14 is secured to a rod member 15 which extends through an opening in the upper portion of the container 11*b*.

The base of the lower portion of the container 11*a* is provided with a thermocouple well 16 and a thermocouple 17 having electrical wires 18 extending therefrom for connection to suitable temperature measuring or controlling apparatus, not shown. The thermocouple 17 is used to provide an indication of the temperature of the solution 13.

The upper portion of the container 11 is provided with an inlet port 19 which extends through the interior of the container and terminates near the base of the lower portion of the container. A gas, such as hydrogen, argon or nitrogen, or combinations thereof, is introduced through the inlet port and exhausted through an outlet port 20 at the top portion of the container. The gas is used to provide a non-reactive environment for the epitaxial growth process. Solution and substrate heating is provided by a furnace 21 which may be of conventional vertical furnace design with suitable resistance heating, if desired.

The practice of our invention can be exemplified by selecting a semi-insulating of GaP, for example, for selective epitaxial growth by first masking the surface of the substrate with a layer of a material which substantially prevents the growth of epitaxial material thereon. Suitable materials for this purpose include silicon dioxide, silicon nitride, silicon oxynitride and aluminum oxide, for example. The masking layer is patterned by photolithographic masking and etching techniques well known in the semiconductor art, for example. After forming the desired pattern in the masking layer, the substrate is attached to the rod member 15 as illustrated in the drawing. If desired, an n-type conductivity region is formed epitaxially in accord with our invention by utilizing a molten solution of gallium saturated with gallium phosphide and containing tellurium, for example. A typical solution for practising our invention contains 100 grams of gallium, 6 grams of gallium phosphide and approximately 0.02 atom per cent of tellurium. The crucible and its contents are placed in the container 11 and the upper portion of the container is placed in mating relation with the lower portion thereof. The container is then purged with hydrogen, for example, to insure a pure hydrogen atmosphere within the container. The container is then placed inside the vertical furnace 21. The furnace temperature is then raised sufficiently to attain a solution temperature of approximately 1030°C. This solution is stirred occasionally to insure uniform composition thereof and hence prevent uncontrolled dissolution of the substrate. The substrate is then immersed into the solution and stirred continuously to maintain a uniform composition of the solution.

If it is desired to embed the n-type epitaxial growth below the surface of the patterned substrate, the solution temperature is first raised by approximately 2°C. shortly after the substrate is immersed into the solution. The depth of dissolution of the substrate surface is dependent upon the time the solution is held at the elevated temperature. For example, after 2 or 3 minutes at this temperature, approximately 150 microns of the substrate surface are removed. The temperature of the solution is then permitted to cool at a rate of from approximately 0.3° to 1.0°C. per minute to promote epitaxial growth by precipitation of the tellurium-doped gallium phosphide on the unmasked portions of the substrate. The growth is allowed to proceed until a temperature of approximately 930° to 980°C. is reached, at which time the substrate is removed from the solution and the container is withdrawn from the furnace.

Figure 2:
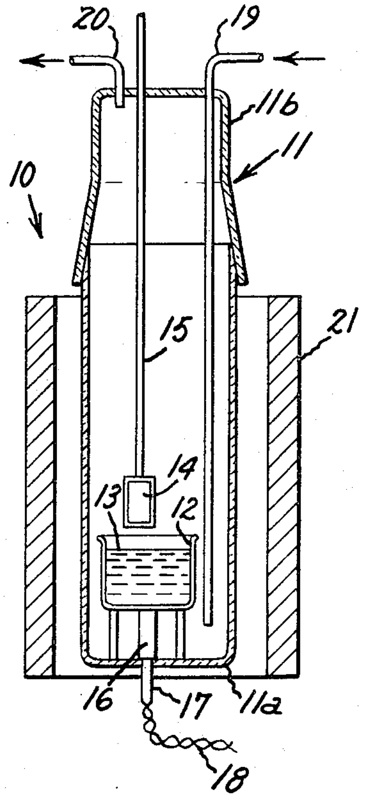
FIG. 2 is a schematic diagram of one apparatus for performing a liquid phase epitaxial growth in accord with our invention.

Although the substrate is illustrated in FIG. 2 as being held in a vertical position, it is to be understood that either a vertical or horizontal position may be employed, if desired. When a vertical position is employed, epitaxial growth may be terminated at any time merely by removing the substrate from the solution. However, when a horizontal position is employed for the substrate, some solution remains on the surface of the substrate and hence the epitaxial growth is not stopped completely by removal from the solution.

The foregoing process steps provide for selective epitaxial growth of n-type gallium phosphide on a semi-insulating substrate of gallium phosphide. This n-type growth forms in the patterned regions of the substrate and includes a portion thereof extending below the surface of the substrate to the extent of the dissolution of the substrate before regrowth of the n-type region is begun. Typically, dissolution depths of up to 150 microns or more and growth thickness of up to 200 microns or more are achieved in accord with the foregoing process steps.

One of the particularly advantageous characteristics of our present invention is that the absolute temperature of the solution may vary by up to approximately plus or minus 5°C. without adversely affecting the growth process. Prior art epitaxial processes, however, require the solution temperatures to be maintained at approximately the saturation point and hence absolute temperature control (i.e., plus or minus 0.25°C.) is required. In accord with our invention, a saturated solution with excess semiconductor material is provided and hence the absolute temperature of the solution is not critical. In further accord with our invention, it is only the temperature difference between the time when the substrate enters the solution and the abrupt increase in temperature necessary to produce dissolution of the substrate which must be controlled. However, this type of temperature control is much more readily achieved than providing an absolute temperature of the solution as required by prior art processes.

The formation of p-type regions by the selective liquid epitaxial growth process of our invention differs slightly from the n-type growth, primarily because the p-type growth solution includes volatile constituents. For example, the growth of p-type gallium phosphide includes such dopants as zinc and oxygen. Both of these elements are very volatile at the growth temperatures of the epitaxy process and accordingly desired concentration levels can only be maintained if the volatile constituents are prevented from escaping.

Figure 3:
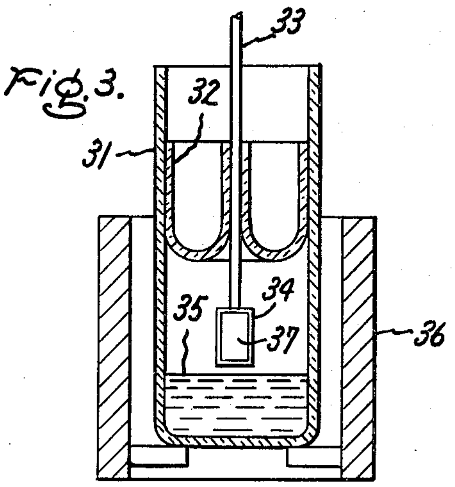
FIG. 3 is a schematic diagram of another apparatus for performing a liquid phase epitaxial growth in accord with another aspect of our invention.

FIG. 3 illustrates suitable apparatus for liquid phase epitaxial growth of materials having volatile constituents which is simple, demountable and reusable. Briefly, this apparatus includes an outer container 31 such as a quartz tube, having a bottom and side walls with an open top. A coaxially shaped inner tube member 32 slides in close fitting relation with the inner walls of the outer container 31 to produce a tightly fitting connection therebetween. The inner diameter of the coaxial tube 32 is constructed to permit the passage of a rod 33 therethrough with a suitable substrate holder 34, for example, attached at one end thereof. By making the outer container 31, the coaxial tube 32 and the rod 33 of quartz, for example, the parts may be lapped and polished to tolerances which produce a substantially sealed volume at the bottom of the container while permitting the apparatus to be demounted and reused subsequently.

FIG. 3 illustrates the bottom portion of the container 31 as including a solution 35 which is heated by a furnace 36. A substrate 37 attached to the substrate holder 34 may then be lowered into the solution 35 with the rod 33 until the desired epitaxial growth is achieved since the volatile constituents are confined to the sealed volume near the bottom of the container 31. This apparatus and methods for making the same are more fully disclosed and claimed in the above-reference application Ser. No. 116,126.

The formation of p-type epitaxial growths of GaP, for example, includes similar process steps described above with reference to FIG. 1; however, apparatus similar to that illustrated in FIG. 3 is used to perform the epitaxial growth. The sealed volume of this apparatus insures that the concentration of the volatile constituents is substantially constant throughout the epitaxial growth process, thereby insuring uniformity in the epitaxial growth. By way of example, a p-type epitaxial growth is provided by preparing a slightly saturated solution with an excess of the semiconductor material to be grown. For example, for GaP growths, a slightly saturated solution is obtained by including approximately 35 to 100 grams of pure gallium together with approximately 6 percent by weight of pure GaP. A solution of this composition is slightly saturated at 1050°C. To this solution, between approximately 0.01 and 0.4 molar per cent of pure $Ga_2O_3$ powder is added, computed on the basis of the amount of gallium initially added. The container including this solution is assembled with a stirring rod in place of the substrate holding rod and the container is placed in the furnace. The temperature of the furnace is increased until the solution temperature is between approximately 1050° to 1100°C. The solution is held at this temperature for approximately 10 minutes while being stirred. This heating and stirring predissolves the GaP and disperses the $Ga_2O_3$ powder. The container is then removed from the furnace and allowed to cool to room temperature.

After the solution has cooled, pure zinc, for example, is added as an acceptor dopant to the extent of 0.02 to 0.1 atom percent, calculated on the basis of the amount of pure gallium added initially. The stirring rod is then replaced with a substrate holding rod, substantially similar to that illustrated in FIG. 3 and a suitable substrate of semi-insulating GaP, for example, is affixed to the substrate holder. For selective liquid phase epitaxy, the substrate may include suitable masking and patterning to produce the desired epitaxial growth. Typical masking materials include silicon dioxide, silicon nitride, silicon oxynitride and other useful masking materials. For silicon dioxide, masking layers of between approximately 2500 and 5000 Angstroms perform satisfactorily.

The container with its solution, dopants and the substrate held in place above the solution is then returned to the furnace and heated to a temperature of approximately 1050°C. The solution is maintained at this temperature for a sufficiently long period of time to insure solution saturation. Generally, approximately 15 minutes is satisfactory. If desired, the substrate holding rod may include a "sweeper bar" fixed at the bottom end of the substrate holder so that it may be used to stir the solution before immersing the substrate into the solution. The substrate is then immersed into the solution, while the rod is rotated so that the solution is constantly being stirred during immersion. If the p-type growth is to be partially embedded into the substrate, dissolution of the substrate is affected by raising the solution temperature approximately 1° or 2°C. After approximately two or three minutes at this elevated temperature, the temperature of the solution is permitted to decrease at a programmed rate of from approximately 3° to 10°C. per minute. If no dissolution is desired, the programmed rate of cooling is started shortly after the substrate is immersed into the solution. The epitaxial growth is then permitted to proceed until a temperature of approximately 700°C. is attained, at which time the container and its contents are removed from the furnace.

If the substrate is held in a vertical position, as illustrated in FIG. 3, the epitaxial growth may be terminated at any time merely by removing the substrate from the solution. However, if the substrate is held in a horizontal position, i.e., parallel to the solution surface, the substrate is preferably held in the solution until the temperature of the solution falls below the growth temperature. This avoids possible undesirable "overgrowth" by some of the solution remaining on the surface of the substrate.

Those skilled in the art can readily appreciate that our novel selective liquid phase epitaxy process now permits the fabrication of monolithic integrated circuits including, for example, light-emitting devices. In further accord with our invention, integrated circuit elements may now be formed along the major surface of a semiconductor substrate so that the circuit elements are planar or substantially planar with respect to this surface. As a result of our invention, planar monolithic semiconductor devices, such as matrix-addressable alphanumeric display devices are now possible. Other configurations of integrated circuit elements are also made possible by the process of our invention. For example, in addition to light-emitting devices, the fabrication of bipolar transistors, field-effect transistors and numerous other semiconductor elements may now be formed in accord with our invention.

A planar monolithic matrix-addressable alphanumeric display device, for example, is fabricated in accord with the process of our present invention in the following manner. A substrate or wafer of undoped or semi-insulating GaP, for example, is used as the starting material. This substrate may, for example, be cut from a pulled single crystal ingot or wafer-grown by a vapor epitaxy process, or other suitable means, well known in the semiconductor art. The substrate desirably has a [111] Miller crystallographic orientation with all epitaxial growths made on the [111 B] surface (or phosphorus surface) since this provides a better surface for liquid phase epitaxial growths. The substrate is first provided with a masking layer, such as silicon dioxide, having a thickness of approximately 2500 Angstroms. The masking layer is then patterned by well known photolithographic masking and etching techniques to produce a pattern of parallel stripes, for example. The stripes may, for example, be approximately 10 mils in width on 20 mil centers. The substrate is then placed on a substrate holder and subjected to an n-type dissolution and regrowth process as described above with reference to FIGS. 1 and 2. The dissolution may, for example, be of 2- to 4-mil depth with subsequent regrowth to the surface of the masking layer. After the desired epitaxial growth, the substrate is removed from the solution and after cooling, is polished and lapped such that the n-type growths are substantially planar with the surface of the substrate.

The next step in the process is to provide p-type growths substantially coplanar with the n-type growths and perpendicular thereto by using the above-described epitaxial growth process. This is achieved, for example, by again masking the substrate surface with $SiO_2$ or $Si_3N_4$, for example, and patterning this masking layer with 15-mil stripes, for example, on 20-mil centers. The substrate is then subjected to p-type liquid epitaxial growth in the manner described above. The resulting structure produces an array of diodes or P-N junctions formed at each intersection of a P and N stripe. The p-type stripes are then lapped to a thickness of approximately 25 microns, for example. The resultant device is therefore a substantially planar matrix of light-emitting diodes formed by a double liquid phase epitaxy process.

The matrix-addressable alphanumeric display device is completed by evaporating a 2000 Angstroms thick layer of gold-zinc, for example, over the entire surface of the substrate. A layer of nickel, for example, is then electroplated over the gold-zinc layer. This film is then alloyed with the GaP to provide a low conductivity ohmic contact to the p-type region. This alloy film also functions as an optical absorber, as will become more apparent from the following description.

At the intersection of each P- and N-type stripe, a hole having a diameter of approximately 10 mils, for example, is etched through the gold-zinc film to provide for light emission therethrough. These holes, may be formed by photolithographic masking and etching techniques, such as using pyrolytically deposited silicon dioxide as a mask and aqua regia as an etchant. Subsequently, or at the same time that the holes are etched, grooves are etched through the conductive film to separate each P-type stripe from each other P-type stripe. The grooves are typically 2.5 mils wide.

Next, the reverse side of the substrate is lapped sufficiently to expose the N-type stripes embedded in the substrate. The large substrate is then cut into individual arrays, if desired, including five rows of diodes by seven rows of diodes, thus providing 35 light-emitting diodes per array. The matrix-addressable array is then completed by alloying the five-by-seven array to a gold-tin plated ceramic chip, for example. The gold-tin is etched in a pattern such that leads are provided for each N-type stripe. The connection to the seven N-type stripes are conveniently formed simultaneously with the alloying operation. This N-type alloy stripe on the bottom surface of the array, in conjunction with the P-type alloy on the opposite surface of the array, serve as optical absorbers to prevent light spreading and to permit sharp delineation of the specific light-emitting area in the optically transparent semi-insulating substrate. The array is completed by bonding wires to each P-type stripe so that each row and column may be individually addressed. An alphanumeric display is provided by passing an electrical current through selected rows and columns, as is well known in the art.

Those skilled in the art can readily appreciate that a planar monolithic matrix-addressable alphanumeric display device as described above has wide utility for display purposes in general, and specifically to various computer read-out displays. For a more detailed description of the fabrication of this and other display devices employing the above-described process, reference is made to our concurrently filed copending application Ser. No. 116,005 of common assignee as the instant invention.

In summary, we have disclosed a novel selective liquid phase epitaxial growth process for making various semiconductor devices. This process overcomes the prior art difficulties associated with liquid phase epitaxy and advantageously provides for uniform dissolution and regrowth of semiconductor material on a substrate so that an epitaxially grown region is embedded in the substrate, if desired. The use of a solution saturated with an excess of the semiconductor material to be epitaxially deposited, overcomes the absolute temperature control required of prior art processes and additionally permits the substrate to enter the solution perpendicular to the surface thereof and hence enables many substrates to be processed simultaneously.

Although our process is described with reference to gallium phosphide, it is to be understood that this is done primarily for convenience and is not to be construed as a limitation of our process. For example, other semiconductor materials including other Group III–V compounds such as gallium arsenide, indium phosphide and gallium aluminum phosphide, for example, can also be epitaxially formed in accord with our invention. Additionally, other semiconductor conductivity-type impurity-modifying materials may be used, if desired.

In view of the foregoing description, it is readily apparent that many modifications and changes may be made to our invention without departing from the spirit and scope thereof. Accordingly, we intend, by the appended claims to cover all such modifications and changes which rely on our teachings and are properly considered within the spirit and scope of this invention.

What we claim as new and desire to secure by Letters Patent of the United States is:

1. A process comprising the steps of preparing a saturated solution of gallium phosphide material in gallium including a conductivity modifying impurity of one type, preparing a substrate of semi-insulating gallium phosphide material having a first plurality of parallel masking stripes to provide a first plurality of parallel unmasked regions, immersing said substrate into said solution, increasing the temperature of said solution by a few degrees above said given temperature to cause dissolution of at least a portion of said substrate, lowering the temperature of said solution below said given temperature whereby said gallium phosphide material is epitaxially deposited on said unmasked regions of said substrate to form stripes of gallium phosphide of said one conductivity type therein, removing said substrate from said solution, forming a planar surface in said substrate including said stripes of one conductivity type separated by stripes of semi-insulating material, forming a second plurality of parallel masking stripes on said planar surface disposed to intersect said stripes of said one conductivity type to provide a second plurality of parallel unmasked regions thereon, preparing another saturated solution of gallium phosphide material in gallium including a conductivity modifying impurity of opposite type, immersing said substrate into said other solution, lowering the temperature of said other saturated solution whereby said gallium phosphide material is epitaxially deposited on said unmasked regions of said substrate to form stripes of gallium phosphide of said opposite conductivity type thereon thereby producing P-N junctions at the intersection of said one-type conductivity stripes with said opposite-type conductivity stripes.

2. The process of claim 1 in which said conductivity modifying impurity of one type is P-type and said conductivity modifying impurity of opposite type is N-type.

3. The process of claim 1 in which said conductivity modifying impurity of one type is N-type and said conductivity modifying impurity of opposite type is P-type.

4. The process of claim 1 in which said second plurality of parallel masking stripes on said planar surface are disposed orthogonally with respect to the stripes of said one conductivity type.

* * * * *